(12) United States Patent
Grant et al.

(10) Patent No.: US 7,015,517 B2
(45) Date of Patent: Mar. 21, 2006

(54) SEMICONDUCTOR DEVICE INCORPORATING A DEFECT CONTROLLED STRAINED CHANNEL STRUCTURE AND METHOD OF MAKING THE SAME

(75) Inventors: John M. Grant, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/137,244

(22) Filed: May 25, 2005

(65) Prior Publication Data
US 2005/0205936 A1    Sep. 22, 2005

Related U.S. Application Data

(63) Continuation of application No. 10/677,573, filed on Oct. 2, 2003.

(51) Int. Cl.
H01L 29/30    (2006.01)
(52) U.S. Cl. .................. 257/190; 257/192; 257/347; 257/616; 257/617
(58) Field of Classification Search ............... 257/19, 257/192, 347, 351, 353, 616, 617, 20, 190
See application file for complete search history.

(56) References Cited

U.S. PATENT DOCUMENTS

| | | |
|---|---|---|
| 4,522,662 A | 6/1985 | Bradbury et al. |
| 4,557,794 A | 12/1985 | McGinn et al. |
| 4,619,033 A | 10/1986 | Jastrzebski |
| 4,755,481 A | 7/1988 | Faraone |
| 4,760,036 A | 7/1988 | Schubert |
| 4,891,092 A | 1/1990 | Jastrzebski |
| 4,952,526 A | 8/1990 | Pribat et al. |

(Continued)

FOREIGN PATENT DOCUMENTS

EP        0 391 081 A2    3/1990

(Continued)

OTHER PUBLICATIONS

Langdo et al., "High Quality Ge on Si by Epitaxial Necking," *Applied Physics Letters*, Jun. 19, 2000, vol. 76, No. 25, pp. 3700-3702.

*Primary Examiner*—Minh-Loan Tran
(74) *Attorney, Agent, or Firm*—Michael Balconi-Lamica; Robert L. King

(57) ABSTRACT

A semiconductor device includes a single crystal substrate and a dielectric layer overlying the substrate. The dielectric layer includes at least one opening having a first portion and an overlying second portion. The first portion has a depth and width, such that an aspect ratio of the depth to width is greater than one. The semiconductor device further includes a first material having a first portion and a second portion, the first portion of the first material filling the first portion of the at least one opening. Defects for relaxing strain at an interface between the first material and the substrate material exist only within the first portion of the first material due to the aspect ratio being greater than one. The second portion of the first material is substantially defect free. Furthermore, the second portion of the first material and an overlying second material different than the first material fill the overlying second portion of the at least one opening. The second material has a thickness which is less than a critical thickness to maintain the second material in a strained state. The strained second material functions as a channel for charge carriers.

10 Claims, 3 Drawing Sheets

U.S. PATENT DOCUMENTS

| | | |
|---|---|---|
| 5,120,666 A | 6/1992 | Gotou |
| 5,202,284 A | 4/1993 | Kamins et al. |
| 5,273,921 A | 12/1993 | Neudeck et al. |
| 5,445,107 A | 8/1995 | Roth et al. |
| 5,963,817 A | 10/1999 | Chu et al. |
| 6,110,278 A | 8/2000 | Saxena |
| 6,214,653 B1 | 4/2001 | Chen et al. |
| 6,228,691 B1 | 5/2001 | Doyle |
| 6,261,878 B1 | 7/2001 | Doyle et al. |
| 6,326,272 B1 | 12/2001 | Chan et al. |
| 6,362,071 B1 * | 3/2002 | Nguyen et al. ............. 438/416 |
| 6,392,253 B1 | 5/2002 | Saxena |
| 6,429,099 B1 | 8/2002 | Christensen et al. |
| 6,492,216 B1 | 12/2002 | Yeo et al. |
| 6,831,350 B1 * | 12/2004 | Liu et al. .................... 257/617 |
| 2002/0123167 A1 | 9/2002 | Fitzgerald |
| 2002/0123183 A1 | 9/2002 | Fitzgerald |
| 2002/0125471 A1 | 9/2002 | Fitzgerald et al. |
| 2002/0125475 A1 | 9/2002 | Chu et al. |
| 2003/0025131 A1 | 2/2003 | Lee et al. |
| 2003/0057416 A1 | 3/2003 | Currie et al. |
| 2003/0057439 A1 | 3/2003 | Fitzgerald |
| 2004/0121507 A1 * | 6/2004 | Bude et al. ................... 438/93 |
| 2004/0135138 A1 | 7/2004 | Hsu et al. |

FOREIGN PATENT DOCUMENTS

| | | |
|---|---|---|
| WO | WO 03/001671 A2 | 1/2003 |
| WO | WO 03/015142 A2 | 2/2003 |

\* cited by examiner

US 7,015,517 B2

SEMICONDUCTOR DEVICE INCORPORATING A DEFECT CONTROLLED STRAINED CHANNEL STRUCTURE AND METHOD OF MAKING THE SAME

RELATED APPLICATION

This application is a continuation of U.S. Ser. No. 10/677,573, filed Oct. 2, 2003.

This is related to U.S. patent application Ser No. 10/677,573 filed Oct. 2, 2003, and entitled "Semiconductor Structure with Different Lattice Constant Materials and Method for Forming the Same" and is incorporated herein by reference and assigned to the current assignee hereof.

BACKGROUND

1. Field of the Invention

The present invention relates generally to semiconductor devices and method of making the same, and more particularly, to a semiconductor device incorporating a defect controlled strained channel structure and method of making the same.

2. Related Art

In the manufacture of semiconductor devices, various isolation structures for CMOS and methods of fabrication are known. One type of isolation structure includes inverse slope isolation. With respect to inverse slope isolation, it possesses a high probability of not terminating defects, for example, from the deposition of SiGe on Si, on a sidewall of the isolation. In addition, fabrication of a sloped sidewall isolation structure is difficult with current process tools and may not be controllable enough for manufacturing.

Accordingly, an improved semiconductor structure and method of making the same is desired.

SUMMARY

According to one embodiment, a semiconductor device includes a single crystal substrate and a dielectric layer overlying the substrate. The dielectric layer includes at least one opening having a first portion and an overlying second portion. The first portion has a depth and width, such that an aspect ratio of the depth to width is greater than one. The semiconductor device further includes a first material having a first portion and a second portion, the first portion of the first material filling the first portion of the at least one opening. Defects for relaxing strain at an interface between the first material and the substrate material exist only within the first portion of the first material due to the aspect ratio being greater than one. The second portion of the first material is substantially defect free. Furthermore, the second portion of the first material and an overlying second material different than the first material fill the overlying second portion of the at least one opening. The second material has a thickness which is less than a critical thickness to maintain the second material in a strained state. The strained second material functions as a channel for charge carriers. Additional embodiments are also disclosed.

BRIEF DESCRIPTION OF THE DRAWINGS

The embodiments of the present disclosure are illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve an understanding of the embodiments of the present disclosure.

DETAILED DESCRIPTION

Figure 1A:
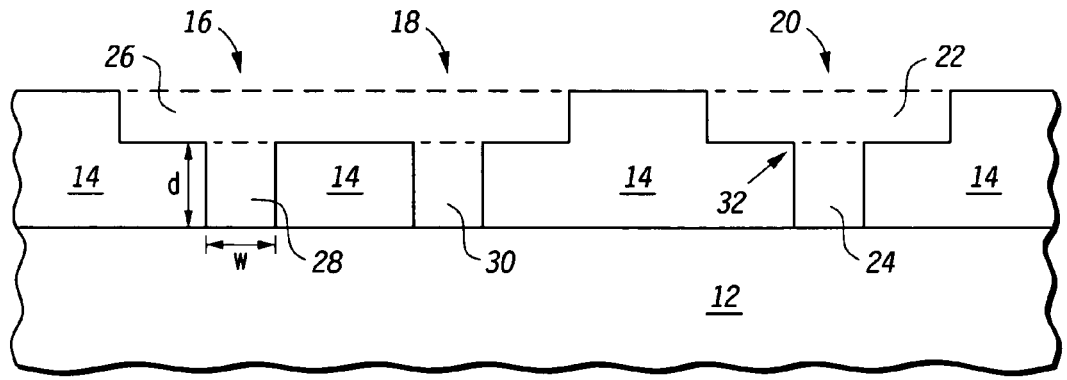
FIG. 1A is a cross-sectional view of one stage in a process of making a semiconductor device incorporating a defect controlled strained channel structure according to an embodiment of the present disclosure.
Figure 1B:
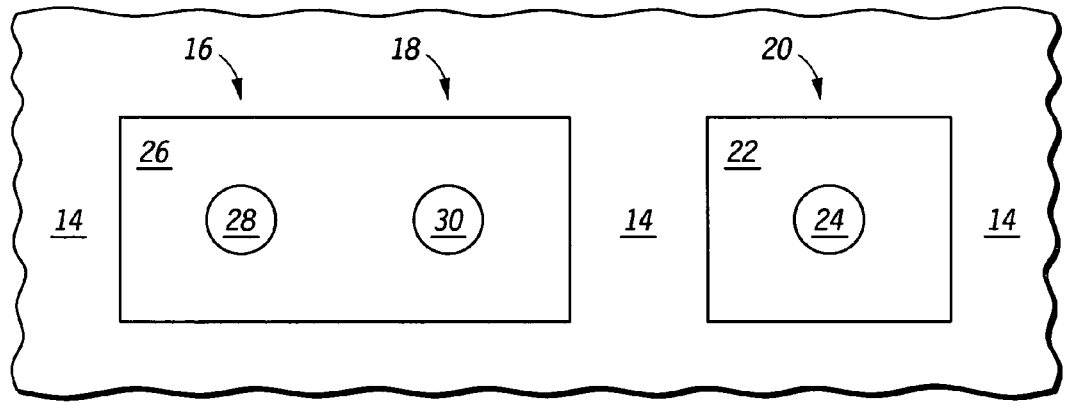
FIG. 1B is a top view of the structure of FIG. 1A.
Figure 2:
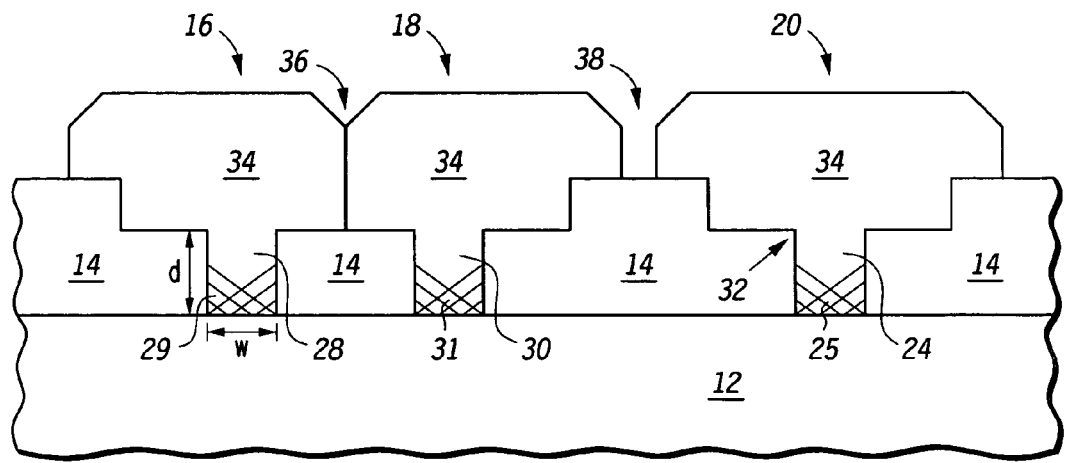
FIGS. 2–3 are cross-sectional views of various additional stages in a process of making a semiconductor device incorporating a defect controlled strained channel structure according to an embodiment of the present disclosure.
Figure 3:
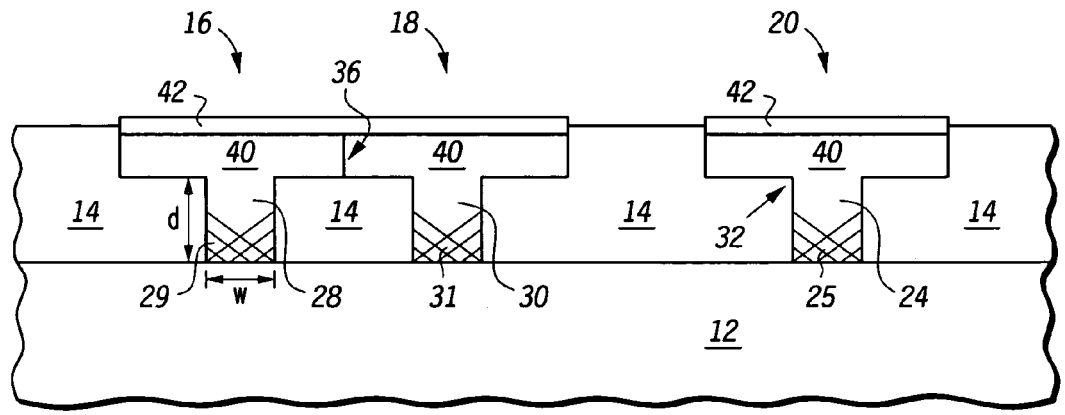

FIGS. 1–3 are cross-sectional views of various stages in a process of making a semiconductor device incorporating a defect controlled strained channel structure according to an embodiment of the present disclosure. As shown in FIG. 1A, semiconductor device 10 includes a substrate 12 and a dielectric layer 14 overlying the substrate. Substrate 12 includes any single crystal substrate, for example, a bulk silicon substrate, an SOI substrate, silicon on sapphire, or the like. Dielectric layer 14 includes any suitable dielectric layer, for example, a silicon dioxide, oxides, nitrides, or the like.

Locations of defect controlled strained channel structures, yet to be fabricated, are shown in FIGS. 1A and 1B as indicated by reference numerals 16, 18, and 20. An active region opening 22 is disposed over a substrate via 24, in location 20. Similarly, an active region opening 26 is disposed over both substrate vias 28 and 30, corresponding to locations 16 and 18, respectively. FIG. 1B is a top view of the structure of FIG. 1. For a given defect controlled strained channel structure location, the corresponding substrate via is characterized by a width dimension "w" and a depth dimension "d." In one embodiment, the aspect ratio of d/w is greater than 1.

Formation of the active region opening and the underlying substrate can be performed in any order, using any suitable conventional patterning and etching techniques. In one embodiment, an active region opening is formed prior to the underlying substrate via. As a result, undesirable rounding of corners of the underlying substrate via can be substantially reduced. For example, by forming the active region opening 22 first, followed by forming of the substrate via 24, corner 32 will include a substantially sharp well defined corner, that is, more than if the substrate via had been formed prior to the active region opening. Formation of active region opening 26 and substrate vias 28, 30 can be similarly formed. The particular dimensions of an active region opening and an underlying substrate via are determined according to the particular requirements of a semiconductor device design, so long as the aspect ratio of d/w, of an individual substrate via of a given location of a defect controlled strained channel structure, is greater than 1.

In FIG. 2, a single crystal semiconductor material 34 is epitaxially grown selectively with respect to the dielectric layer 14, using any suitable epitaxial growth technique. The single crystal semiconductor material 34 is selected to promote formation, or allow the achievement, of a desired strained layer in a defect controlled strained channel structure made according to an embodiment of the present disclosure. For example, the single crystal semiconductor material may include SiGe.

Epitaxial growth begins with deposition of the single crystal semiconductor material occurring on exposed surfaces of the underlying substrate 12 within a bottom portion of a respective substrate via, without growth on the sidewalls of the dielectric 14. During an initial growth period, defects begin forming within the epitaxial growth in response to the growth reaching or attaining a first critical thickness within a respective substrate via. Subsequent to the epitaxial growth exceeding the critical thickness, defects form in a region extending from the bottom of a respective substrate via and propagating at a material dependent angle until the defects reach and are terminated by a sidewall of the substrate via. For example, with respect to SiGe epitaxially grown over silicon, the propagation angle for defects is on the order of approximately 45 degrees. As shown in FIG. 2, defects are included within defect filled regions of the substrate vias as indicated by reference numerals 25, 29 and 31, corresponding to substrate vias 24, 28 and 30, respectively.

Subsequent to the defects propagating and reaching the sidewalls of the substrate vias, the epitaxial growth thereafter continues defect free so as to fill the remainder of the substrate vias and corresponding overlying active region openings with defect free epitaxial growth. Accordingly, defect free regions are formed, otherwise referred to herein as relaxed regions. Furthermore, with respect to the epitaxial growth in the active region openings, and subsequent to being planarized, the defect free epitaxial growth enables the formation of relaxed active regions. As shown in FIG. 2, epitaxial growth of material 34 is continued until a desired lateral overgrowth is achieved. The lateral overgrowth of material 34 in the locations 16 and 18 abut one another and form a seam 36. The lateral overgrowth of material 34 in the locations 18 and 20 are not required to abut one another, leaving a gap 38.

The structure of FIG. 2 is then planarized at least down to a top surface of dielectric layer 14 using any suitable planarization technique. For example, the planarization technique may include CMP, etch back, or the like. In one embodiment, the structure of FIG. 2 is planarized with CMP, such that a top portion of the epitaxially grown material in a corresponding active region opening location is slightly recessed with respect to the top surface of dielectric 14, forming corresponding active region epi as indicated by reference numeral 40 in FIG. 3.

A strained layer 42 is then formed upon the active region epi 40. In one embodiment, formation of the strained layer 42 is accomplished by a process of a selective epitaxial deposition of a single crystal silicon material. For example, the single crystal layer 42 can include epitaxial silicon on a SiGe active region 40. Growth of the single crystal material in layer 42 is controlled to within a critical thickness, wherein the critical thickness corresponds to a not-to-exceed thickness that is sufficient to maintain layer 42 as a strained layer. In the example of a strained Si layer on a SiGe relaxed layer, the critical thickness is on the order of approximately 100 angstroms for a SiGe relaxed layer composed of 70% Si and 30% Ge. A surpassing of the critical thickness results in defect formation and relief of the corresponding strain.

Figure 4:
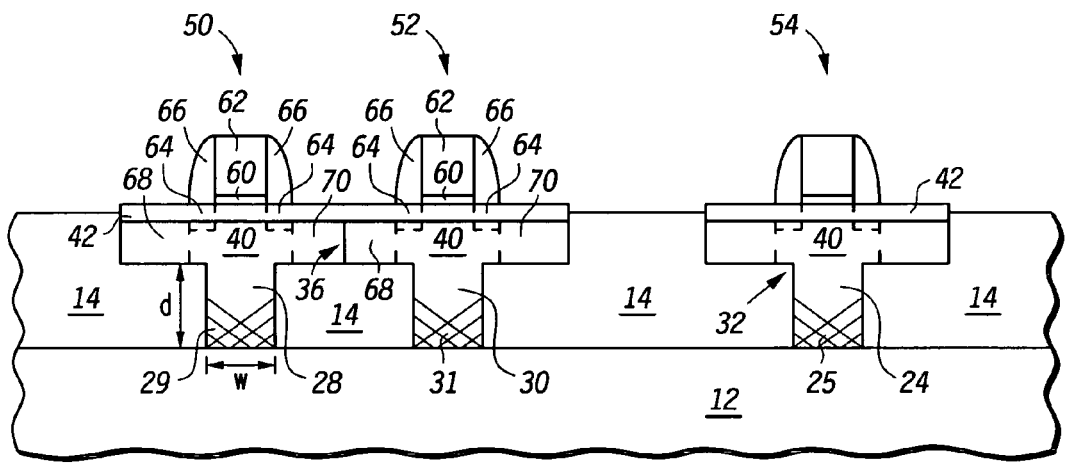
FIG. 4 is a cross-sectional view of a semiconductor device including transistors incorporating a defect controlled strained channel structure according to an embodiment of the present disclosure.

FIG. 4 is a cross-sectional view of a semiconductor device including transistors incorporating a defect controlled strained channel structure according to an embodiment of the present disclosure. Standard processing techniques can be used to form various transistor devices on the formation of the structure shown in FIG. 3, according to the requirements of a particular semiconductor device design. For example, transistors 50, 52 and 54, can be formed as shown in FIG. 4. According to one embodiment, each transistor 50 and 52 includes a gate dielectric 60, gate electrode 62, source/drain extension structures 64, sidewall spacers 66, source/drain regions (68,70). In addition, as shown in FIG. 4, transistors 50 and 52 abut one another at seam 36, creating a common source/drain region between the transistors 50 and 52. The common source/drain region allows for an increased device packing density for semiconductor device 10. Since there is no junction crossing seam 36, any defects or crystal misalignment that may occur at this seam will not degrade device performance or increase device leakage. Transistor 54 can be similar to either of transistors 50 and 52, or different.

Figure 5:
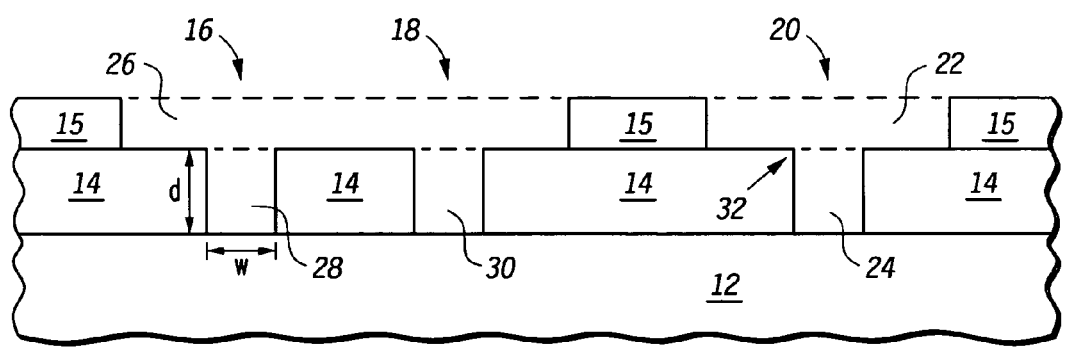
FIG. 5 is a cross-sectional view of a portion of a process of making a semiconductor device incorporating a defect controlled strained channel structure according to another embodiment.

FIG. 5 is a cross-sectional view of a portion of a process of making a semiconductor device incorporating a defect controlled strained channel structure according to another embodiment. In particular, FIG. 5 is substantially similar to the structure shown in FIG. 1A, with the following difference. Semiconductor device 10' includes a second dielectric layer 15 disposed on a top surface of first dielectric layer 14. In one embodiment, active region openings (22,26) are patterned in dielectric layer 15, followed by patterning of substrate vias (24,28,30) in dielectric layer 14, using any suitable patterning and etch techniques. A benefit of the embodiment of FIG. 5 is that the second dielectric layer 15 facilitates an improved control of the depth of the active region openings. That is, the second dielectric layer 15 can be selectively etched with respect to the underlying dielectric layer 14, to form the desired active region openings. In addition, formation of the substrate vias subsequent to the active region openings facilitates sharp corner edges at the tops of the substrate vias, as previously discussed herein above. The structure of FIG. 5 is then processed similarly as discussed with respect to FIGS. 2–4 above.

Figure 6:
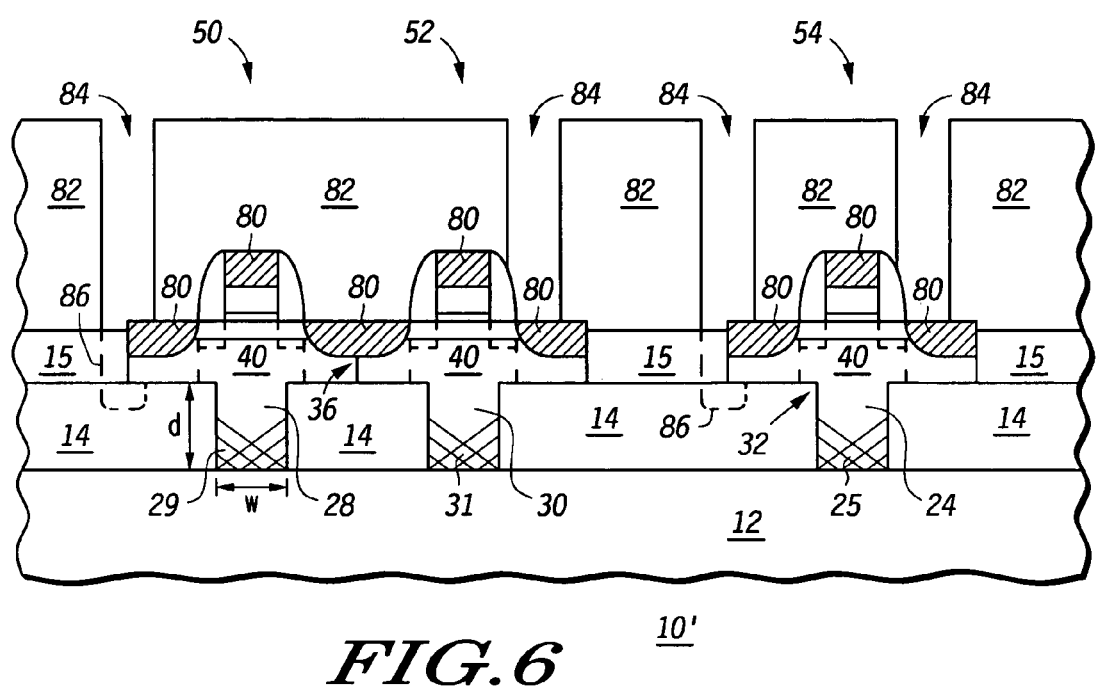
FIG. 6 is a cross-sectional view of a semiconductor device including transistors incorporating a defect controlled strained channel structure according to another embodiment of the present disclosure.

FIG. 6 is a cross-sectional view of a semiconductor device including transistors incorporating a defect controlled strained channel structure according to another embodiment of the present disclosure. The structure of FIG. 6 is similar to that shown in FIG. 4, with the following differences. Subsequent to the transistor formation, various regions are silicided, for example, source/drain regions and gate electrodes, as indicated generally by reference numeral 80. Subsequent to the formation of the silicide regions, another dielectric layer 82 is formed overlying the semiconductor device structure 10' and planarized, using conventional techniques. Contact holes or openings 84 are formed, by conventional patterning and etching techniques, overlying desired contact areas. In one embodiment, dielectric layer 82 comprises a material different from dielectric layer 15. For example, layers 82 and 14 can include silicon dioxide, whereas dielectric layer 15 can include silicon nitride. Accordingly, with the use of a selective etch, dielectric layer 15 prevents the formation of undesirable etching of the dielectric material in region 86 next to an active region, in the event of any misalignment of a contact hole, during formation of respective contact holes 84.

Accordingly, a semiconductor device of the present disclosures includes a single crystal substrate formed of a substrate material. A dielectric layer overlies the single crystal substrate. The dielectric layer includes at least one opening that has a first portion and an overlying second portion. The first portion has a predetermined depth and a predetermined width, such that an aspect ratio of the predetermined depth to the predetermined width is greater than one. The semiconductor device further includes a first material having a first portion and a second portion, the first portion of the first material filling the first portion of the at least one opening. Defects for relaxing strain at an interface between the first material and the substrate material exist only within the first portion of the first material due to the aspect ratio being greater than one. Accordingly, the second portion of the first material is substantially defect free.

The semiconductor device further includes the second portion of the first material and an overlying second material different than the first material filling the overlying second portion of the at least one opening. The second material has a thickness which is less than a critical thickness to maintain the second material in a strained state. Lastly, the strained second material functions as a channel for charge carriers.

In one embodiment of the semiconductor device, part of the second portion of the first material is laterally extended beyond the at least one opening to form a T-shape structure. T-shape structures are formed of a respective substrate via and corresponding overlying active areas. In one embodiment, the substrate vias connect the corresponding active areas to the underlying substrate and are well suited for terminating defects arising from the epitaxial deposition, for example, of SiGe on Si.

Accordingly, large area active structures can be fabricated while having defects terminate below the active device areas. The T-shape structure allows low leakage SOI-like source/drain structures to be fabricated with channels tied to the substrate, alleviating floating body issues while still retaining the low source/drain leakage to the well associated with SOI devices. In addition, a control electrode can be formed on the T-shape structure overlying a predetermined portion of the second material. A first current electrode is formed in the second material and offset from a first side of the control electrode. Lastly, a second current electrode is formed in the second material and offset from a second side of the control electrode.

With the T-shape structure, adjacent devices can be fabricated while still maintaining a structure which results in termination of the strain relieving defects below the device area. Furthermore, an epi seam, as discussed herein above, is in the source/drain area which undergoes silicidation on the surface. Accordingly, no junction crosses the seam, so no leakage will be induced from any defects at the epi seam.

In another embodiment, the first current electrode can be formed in both the second material and a third portion of the first material, and the second current electrode can be formed in both the second material and a fourth portion of the first material. In a further embodiment, the control electrode is aligned vertically, overlying the at least one opening, thereby reducing floating body effects.

In yet another embodiment, the semiconductor device further includes a second dielectric layer overlying the dielectric layer. The second dielectric layer includes a different dielectric material than the first dielectric layer and is disposed adjacent the first current electrode and the second current electrode.

Still further, the semiconductor device can include a second opening in the dielectric layer, the second opening being filled with the first material and the overlying second material. In addition, the second opening includes an overlying second control electrode adjoined by a third current electrode and a fourth current electrode. The third current electrode is formed in direct physical contact with the second current electrode via a lateral extension of part of the second portion of the first material.

In still another embodiment, the semiconductor device further includes a second opening in the dielectric layer that is filled with the first material and the overlying second material. The second opening includes an overlying second control electrode adjoined by a third current electrode and a fourth current electrode. The first current electrode and the second current electrode are electrically isolated from the third current electrode and the fourth current electrode by the dielectric layer.

According to another embodiment, a semiconductor device comprises a single crystal substrate; an overlying dielectric layer having a first opening and a second opening with an overlying third opening that encompasses both the first opening and the second opening; a single crystal material filling the first opening, the second opening and a portion of the third opening, the single crystal material having controlled defects for relaxing strain at an interface between the single crystal material and the substrate material existing only at interfaces in the first opening and the second opening, the single crystal material overlying controlled defect areas being substantially defect free; a single crystal strain material overlying the single crystal material and filling a remaining portion of the third opening, a thickness of the single crystal strain material being small enough to substantially avoid defect formation; a first transistor formed overlying and within at least the single crystal strain material and aligned to the first opening, the first transistor having a control electrode and first and second current electrodes; and a second transistor formed overlying and within at least the single crystal strain material and aligned to the second opening, the second transistor having a control electrode and first and second current electrodes, the first current electrode of the first transistor being in direct physical contact with the second current electrode of the second transistor allowing electrical interoperability between the first transistor and second transistor.

In the embodiment of the immediately preceding paragraph, the overlying dielectric layer further comprises: a first dielectric overlying the substrate that defines the first opening and the second opening; and a second dielectric that is a different material from the first dielectric that defines the third opening, the different material being used to avoid excessive etching of the first dielectric and second dielectric when making electrical contact to either the first current electrode or the second current electrode.

A method of forming an isolation structure in a semiconductor according to yet another embodiment of the present disclosure comprises: providing a single crystal substrate; forming a first dielectric overlying the substrate; forming a second dielectric overlying the first dielectric, the second dielectric being a different material than the first dielectric; forming a first opening having a first diameter completely through the first dielectric and forming a second opening having a second diameter completely through the second dielectric, the second diameter being equal to or greater than the first diameter wherein the first opening and the second opening expose a surface of the single crystal substrate; filling the first opening and a portion of the second opening with a first single crystal semiconductor material having a relaxed state by having defects for a controlled depth from the single crystal substrate to a predetermined height, a remainder of the first single crystal semiconductor material not having defects; filling a remaining portion of the second opening with a second single crystal semiconductor material that is strained by having a predetermined thickness that does not exceed a critical thickness where defects begin to form; and forming a transistor overlying and within at least a portion of the second opening.

According to another embodiment, the method of the immediately preceding paragraph further comprises: forming the first opening to having a predetermined width and a predetermined depth, a ratio of the predetermined depth to the predetermined width being greater than one in order to define the controlled depth of defects of the first single crystal semiconductor material.

According to yet another embodiment, the method further comprises: using the different material of the second dielectric from the first dielectric as a control parameter to avoid excessive etching of the first dielectric and second dielectric when making electrical contact to a current electrode of the transistor.

Furthermore, the method further comprises: forming a third opening having a third diameter completely through the first dielectric and forming a fourth opening having a fourth diameter completely through the second dielectric, the fourth diameter being equal to or greater than the third diameter wherein the third opening and the fourth opening expose the surface of the single crystal substrate; and filling the third opening and a portion of the fourth opening with the first single crystal semiconductor material having the relaxed state by having defects for a controlled depth from the single crystal substrate to the predetermined height, the remainder of the first single crystal semiconductor material not having defects; filling a remaining portion of the fourth opening with the second single crystal semiconductor material that is strained by having a predetermined thickness that does not exceed a critical thickness where defects begin to form; and forming a second transistor overlying and within at least a portion of the fourth opening, the second transistor being laterally adjacent the first transistor and having a current electrode directly touching a current electrode of the first transistor.

The method of may also further comprise: forming a third opening having a third diameter completely through the first dielectric and forming a fourth opening having a fourth diameter completely through the second dielectric, the fourth diameter being equal to or greater than the third diameter wherein the third opening and the fourth opening expose the surface of the single crystal substrate; and filling the third opening and a portion of the fourth opening with the first single crystal semiconductor material having the relaxed state by having defects for a controlled depth from the single crystal substrate to the predetermined height, the remainder of the first single crystal semiconductor material not having defects; filling a remaining portion of the fourth opening with a fourth single crystal semiconductor material that is strained by having a predetermined thickness that does not exceed a critical thickness where defects begin to form; and forming a second transistor overlying and within at least a portion of the fourth opening, the second transistor being laterally adjacent the first transistor but not directly electrically connected to the first transistor.

According to yet another embodiment of the present disclosure, a method of forming an isolation structure in a semiconductor comprises: providing a single crystal substrate; forming a dielectric overlying the single crystal substrate; forming a first opening having a first diameter through a portion of the dielectric and forming a second opening having a second diameter through a remainder of the dielectric, the second diameter being equal to or greater than the first diameter wherein the first opening and the second opening expose a surface of the single crystal substrate; filling the first opening and a portion of the second opening with a first single crystal semiconductor material having a relaxed state by having defects for a controlled depth from the single crystal substrate to a predetermined height, a remainder of the first single crystal semiconductor material not having defects; filling a remaining portion of the second opening with a second single crystal semiconductor material that is strained by having a predetermined thickness that does not exceed a critical thickness where defects begin to form; and forming a transistor overlying and within at least a portion of the second opening.

The method of the immediately preceding paragraph can further comprise: forming the first opening to having a predetermined width and a predetermined depth, a ratio of the predetermined depth to the predetermined width being greater than one in order to define the controlled depth of defects of the first single crystal semiconductor material.

The method may also further comprise: forming a third opening having a third diameter through a second portion of the dielectric and forming a fourth opening having a fourth diameter through a remainder of the second portion of the dielectric, the fourth diameter being equal to or greater than the third diameter wherein the third opening and the fourth opening expose the surface of the substrate; filling the third opening and a portion of the fourth opening with the first single crystal semiconductor material having the relaxed state by having defects for a controlled depth from the single crystal substrate to the predetermined height, the remainder of the first single crystal semiconductor material not having defects; filling a remaining portion of the fourth opening with the second single crystal semiconductor material that is strained by having a predetermined thickness that does not exceed a critical thickness where defects begin to form; and forming a second transistor overlying and within at least a portion of the fourth opening, the second transistor being laterally adjacent the first transistor and having a current electrode directly touching a current electrode of the first transistor.

Still further, the method may also comprise: forming a third opening having a third diameter through a second portion of the dielectric and forming a fourth opening having a fourth diameter through a remainder of the second portion of the dielectric, the fourth diameter being equal to or greater than the third diameter wherein the third opening and the fourth opening expose the surface of the substrate; filling the third opening and a portion of the fourth opening with the first single crystal semiconductor material having the relaxed state by having defects for a controlled depth from the single crystal substrate to the predetermined height, the remainder of the first single crystal semiconductor material not having defects; filling a remaining portion of the fourth opening with the second single crystal semiconductor material that is strained by having a predetermined thickness that does not exceed a critical thickness where defects begin to form; and forming a second transistor overlying and within at least a portion of the fourth opening, the second transistor being laterally adjacent the first transistor but not directly electrically connected to the first transistor.

Yet still further, according to one embodiment, the method further comprises: forming the first single crystal material with silicon germanium; forming the second single crystal material with silicon; forming the single crystal substrate with silicon; and forming the dielectric with one of silicon dioxide or silicon nitride.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements by may include other elements not expressly listed or inherent to such process, method, article, or apparatus.

The invention claimed is:

1. A semiconductor device comprising:
    a single crystal substrate formed of a substrate material;
    a dielectric layer overlying the single crystal substrate, the dielectric layer having at least one opening which has a first portion and an overlying second portion, the first portion having a predetermined depth and a predetermined width, wherein a ratio of the predetermined depth to the predetermined width is greater than one;
    a first material having a first portion and a second portion, the first portion of the first material filling the first portion of the at least one opening, defects for relaxing strain at an interface between the first material and the substrate material existing only within the first portion of the first material due to the ratio being greater than one; and
    the second portion of the first material and an overlying second material different than the first material filling the overlying second portion of the at least one opening, the second material having a thickness which is less than a critical thickness to maintain the second material in a strained state, the second portion of the first material being substantially defect free, the second material functioning as a channel for charge carriers.

2. The semiconductor device of claim 1 wherein part of the second portion of the first material is laterally extended beyond the at least one opening to form a T-shape structure.

3. The semiconductor device of claim 2 further comprising:
    a control electrode formed overlying a predetermined portion of the second material;
    a first current electrode formed in the second material and offset from a first side of the control electrode; and
    a second current electrode formed in the second material and offset from a second side of the control electrode.

4. The semiconductor device of claim 3 wherein the first current electrode is formed in both the second material and a third portion of the first material, and the second current electrode is formed in both the second material and a fourth portion of the first material.

5. The semiconductor device of claim 3 wherein the control electrode is aligned vertically overlying the at least one opening thereby reducing floating body effects.

6. The semiconductor device of claim 3 further comprising:
    a second dielectric layer overlying the dielectric layer, the second dielectric layer being a different dielectric material than the dielectric layer and being adjacent the first current electrode and the second current electrode.

7. The semiconductor device of claim 3 further comprising:
    a second opening in the dielectric layer that is filled with the first material and the overlying second material, the second opening having an overlying second control electrode adjoined by a third current electrode and a fourth current electrode, the third current electrode being in direct physical contact with the second current electrode via a lateral extension of part of the second portion of the first material.

8. The semiconductor device of claim 3 further comprising:
    a second opening in the dielectric layer that is filled with the first material and the overlying second material, the second opening having an overlying second control electrode adjoined by a third current electrode and a fourth current electrode, the first current electrode and the second current electrode being electrically isolated from the third current electrode and the fourth current electrode by the dielectric layer.

9. A semiconductor device comprising:
    a single crystal substrate;
    an overlying dielectric layer having a first opening and a second opening with an overlying third opening that encompasses both the first opening and the second opening;
    a single crystal material filling the first opening, the second opening and a portion of the third opening, the single crystal material having controlled defects for relaxing strain at an interface between the single crystal material and the substrate material existing only at interfaces in the first opening and the second opening, the single crystal material overlying controlled defect areas being substantially defect free;
    a single crystal strain material overlying the single crystal material and filling a remaining portion of the third opening, a thickness of the single crystal strain material being small enough to substantially avoid defect formation;
    a first transistor formed overlying and within at least the single crystal strain material and aligned to the first opening, the first transistor having a control electrode and first and second current electrodes; and
    a second transistor formed overlying and within at least the single crystal strain material and aligned to the second opening, the second transistor having a control electrode and first and second current electrodes, the first current electrode of the first transistor being in direct physical contact with the second current electrode of the second transistor allowing electrical interoperability between the first transistor and second transistor.

10. The semiconductor device of claim 9 wherein the overlying dielectric layer further comprises:
    a first dielectric overlying the substrate that defines the first opening and the second opening; and
    a second dielectric that is a different material from the first dielectric that defines the third opening, the different material being used to avoid excessive etching of the first dielectric and second dielectric when making electrical contact to either the first current electrode or the second current electrode.

* * * * *